United States Patent [19]

Lee

[11] Patent Number: 5,432,108
[45] Date of Patent: Jul. 11, 1995

[54] METHOD FOR FABRICATING A THIN FILM TRANSISTOR

[75] Inventor: Who Y. Lee, Seoul, Rep. of Korea

[73] Assignee: Goldstar Co., Ltd., Seoul, Rep. of Korea

[21] Appl. No.: 327,480

[22] Filed: Oct. 21, 1994

[30] Foreign Application Priority Data

Oct. 21, 1993 [KR] Rep. of Korea ............... 21930/1993

[51] Int. Cl.⁶ ........................................... H01L 21/86
[52] U.S. Cl. ..................................... 437/40; 437/181; 437/246
[58] Field of Search .................... 437/40, 246, 51, 181, 437/101; 148/DIG. 1

[56] References Cited

U.S. PATENT DOCUMENTS

| | | | |
|---|---|---|---|
| 5,032,531 | 7/1991 | Tsutsui et al. | 437/40 |
| 5,047,360 | 9/1991 | Nicholas | 437/40 |
| 5,166,085 | 11/1992 | Wakai et al. | 437/40 |

FOREIGN PATENT DOCUMENTS

| | | | |
|---|---|---|---|
| 63-207176 | 8/1988 | Japan | 437/51 |
| 0125482 | 1/1989 | Japan | 437/40 |
| 4128823 | 4/1992 | Japan | 437/241 |

Primary Examiner—Brian E. Hearn
Assistant Examiner—Michael Trinh
Attorney, Agent, or Firm—Finnegan, Henderson, Farabow, Garrett & Dunner

[57] ABSTRACT

A method for fabricating a thin film transistor which includes steps for, forming a first and a second gate electrode on a transparent insulation substrate, forming a gate insulation film on the exposed surface and forming an active layer on a surface of the gate insulation film overlying the first gate electrode, forming a transparent conductive material pattern on a surface of the active layer overlying the first gate electrode and a pixel electrode on the surface of the gate insulation film extending laterally from the surface of the second gate electrode toward the active layer, forming a source electrode over the surfaces of the active layer and a drain electrode which extends from the other side of the transparent conductive material across the active layer to the surface of one side of the pixel leaving space between the source electrode and the drain electrode, an ohmic contact semiconductor layer automatically formed beneath the source electrode and the drain electrode, removing the exposed semiconductor layer pattern on the active layer positioned between the source electrode and the drain electrode and the transparent conductive material pattern positioned beneath the semiconductor layer pattern successively, and forming an element protection insulation film on the entire exposed surface.

4 Claims, 2 Drawing Sheets

METHOD FOR FABRICATING A THIN FILM TRANSISTOR

BACKGROUND OF THE INVENTION

1. Field of the Invention

This invention relates to a thin film transistor, and more particularly, to a method for fabricating a thin film transistor, which prevents damage to an active layer, by forming a transparent conductive material on the active layer and forming the pixel before forming the ohmic conductive layer. The transparent conductive material serves as an etch stopper when removing an ohmic contact layer positioned between a source and a drain electrode.

2. Discussion of the Related Art

A conventional process for fabricating a thin film transistor is to be explained hereinafter, with reference to FIGS. 1(a)-(f) of the attached drawings.

As shown in FIG. 1(a), gate electrodes 12a and 12b are formed and spaced at a fixed interval on a transparent insulation substrate 11. Then, as shown in FIG. 1(b), a gate insulation film 13 is formed on the gate electrodes 12a and 12b, as well as over the entire exposed surface of the transparent insulation substrate 11.

An active layer 14, having a fixed lateral width, is then formed on a surface of the gate insulation film 13 at a part overlying the upper side of a first gate electrode 12a.

As shown in FIG. 1(c), a pixel 15 is formed on a surface of the gate insulation film 13 at a part overlaying the gate electrode 12b in a vertical direction and a side extending laterally toward the active layer 14 leaving space between the active layer 14 and pixel 15. An example of the material of the pixel 15, is indium tin oxide (ITO).

As shown in FIG. 1(d), by forming high density ohmic contact n conductive material (hereinafter called 'n+' layer) on the exposed surface of the transparent insulation substrate 11, the active layer 14, and on the pixel 15, and carrying out patterning of the formed n+ layer, an ohmic contact n+ layer pattern 16 is formed to cover the surface of the active layer 14, the surface of the space between the active layer 14 and pixel 15, and part of the surface of the pixel 15.

Then, by depositing electrode metal on the exposed surface, and carrying out patterning of the deposited metal, a source electrode 17 is formed on one part of the surface of the active layer 14 and a drain electrode 18 is formed on the surface of the other side of the active layer 14. The drain electrode extends to a portion of the surface of the pixel 15 and a space is provided between the source electrode 17 and the drain electrode 18.

As shown in FIG. 1(e), after removing the part of the ohmic contact n+ layer pattern, which overlies the upper side of the active layer 14 positioned between the source and the drain electrodes 17 and 18, as shown in FIG. 1(f), a protection insulation film 19 is formed over the entire exposed surface.

This conventional process is liable to damage the active layer 14 because of the large amount of etching of the ohmic contact n+ layer, which is required for removing the exposed ohmic contact n+ layer pattern, from above the active layer 14 after the source and the drain electrode 17 and 18 are formed.

SUMMARY OF THE INVENTION

An object of this invention is to solve the foregoing problems and prevent damage to an active layer, by forming a transparent conductive material on the active layer and, forming the pixel before forming the ohmic conductive layer. The transparent conductive material serves as an etch stopper when removing an ohmic contact layer positioned between a source and a drain electrode.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a method for fabricating a thin film transistor comprising steps for, forming a first gate electrode and a second gate electrode spaced at a fixed interval on an exposed surface of a transparent insulation substrate. A gate insulation film is formed on the entire exposed surface and an active layer is formed on a surface portion of the gate insulation film overlying the first gate electrode. Transparent conductive material is deposited on the entire exposed surface and the deposited conductive material is patterned to form a transparent conductive material pattern on a surface portion of the active layer overlying an upper side of the first gate electrode and a pixel electrode is formed on a surface portion of the gate insulation film extending laterally from the surface portion of the gate insulation film overlying the second gate electrode toward the active layer leaving space between the active layer and the pixel electrode. Successively, an ohmic contact semiconductor layer and an electrode metal having a designated conduction type are formed on the entire exposed surfaces and patterning of both is effected to form a source electrode over the exposed surfaces of one side of the active layer and to form a drain electrode on the other side of the active layer, the drain electrode extending laterally from the other side of the active layer to the surface portion of one side of the pixel electrode leaving space between the drain electrode and the source electrode. An ohmic contact semiconductor layer is automatically formed beneath the source electrode and the drain electrode. And lastly, an element protection insulation film is formed on the entire exposed surface after successively removing exposed semiconductor layer pattern on the active layer positioned between the source electrode and the drain electrode and the transparent conductive material pattern positioned beneath the semiconductor layer pattern.

DETAILED DESCRIPTION OF THE PREFERRED EMBODIMENTS

An embodiment of this invention for obtaining the object of this invention described above is explained hereinafter with reference to FIGS. 2(a)–2(f) of the attached drawings.

Figure 1A:
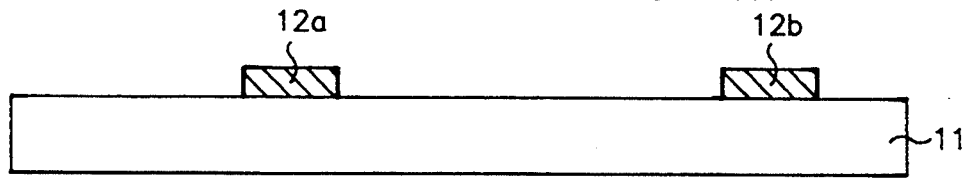
FIGS. 1(a)-1(f) are sectional views showing successive steps in a conventional process for fabricating a thin film transistor.
Figure 1B:
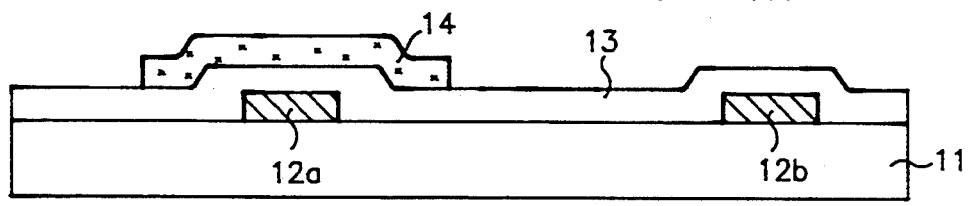
Figure 1C:
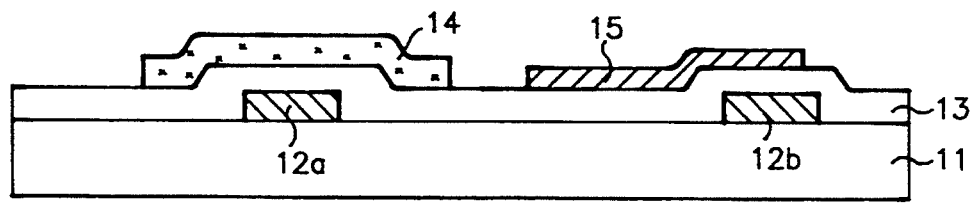
Figure 1D:
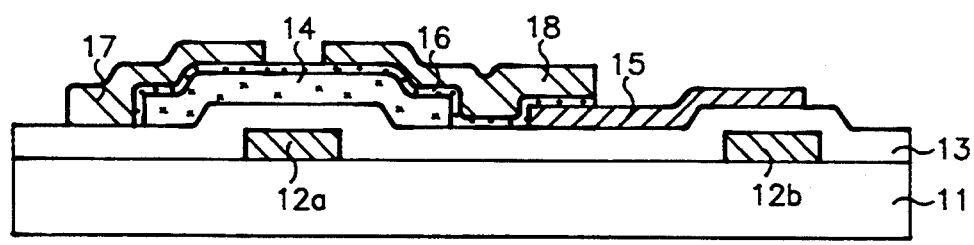
Figure 1E:
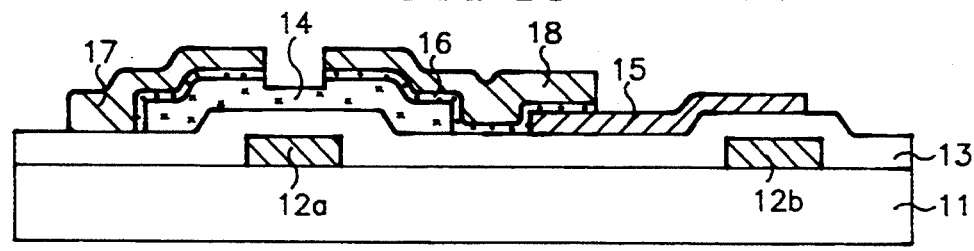
Figure 1F:
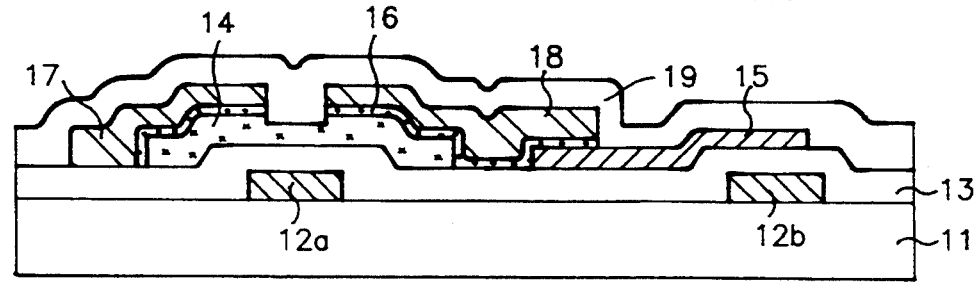
Figure 2A:
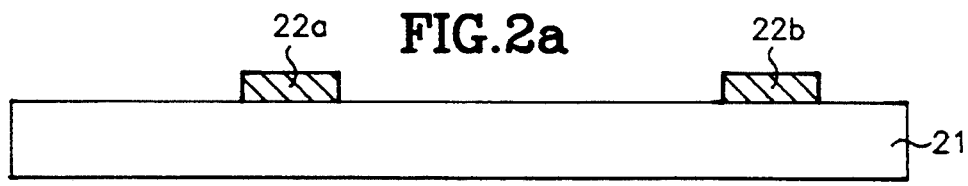
FIGS. 2(a)-2(f) are sectional views showing successive steps in a process for fabricating a thin film transistor in accordance with this invention.

As shown in FIG. 2(a), a first gate electrode 22a and a second gate electrode 22b are formed and spaced at a fixed interval on a transparent insulation substrate 21.

Figure 2B:
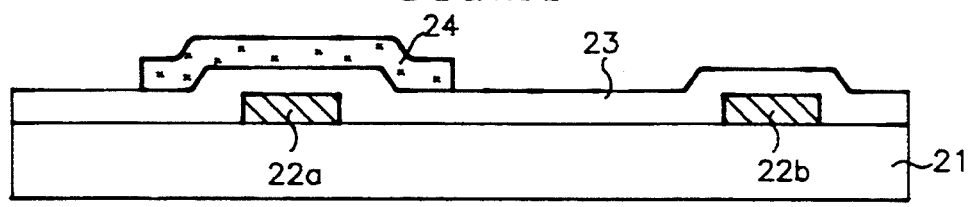

As shown in FIG. 2(b), a gate insulation film 23 is formed on the entire exposed surfaces of the first gate electrode 22a, the second gate electrode 22b and the transparent insulation substrate 21. An active layer 24, having a fixed lateral width, is formed on the surface of the gate insulation film 23 overlying the first gate electrode 23.

In this preferred embodiment, the active layer 24 is formed of intrinsic amorphous silicon and is laterally wider than the first gate electrode 22a.

Figure 2C:
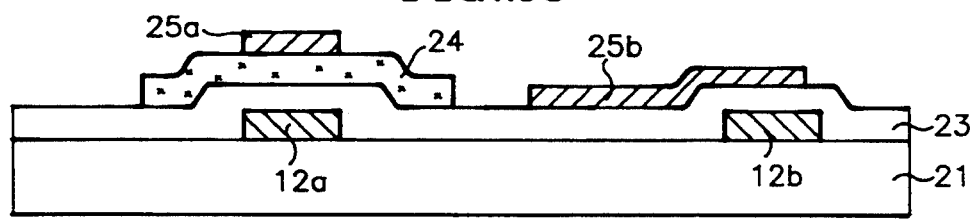

As shown in FIG. 2(c), an ITO film pattern 25a is formed having the same lateral width as the first gate electrode 22a and is placed facing the first gate electrode 22a on the surface of the active layer 24. Then, by depositing transparent conductive material of an indium tin oxide (ITO) film on the entire exposed surface of the active layer 24 and gate insulation film 23 and carrying out patterning of the deposited conductive material of an ITO film, a pixel electrode 25b is formed on the gate insulation film 23. The pixel electrode 25b extends from a part overlying the upper side of the second gate electrode 22b toward the active layer 24 leaving space between the active layer 24 and the pixel electrode 25b.

Figure 2D:
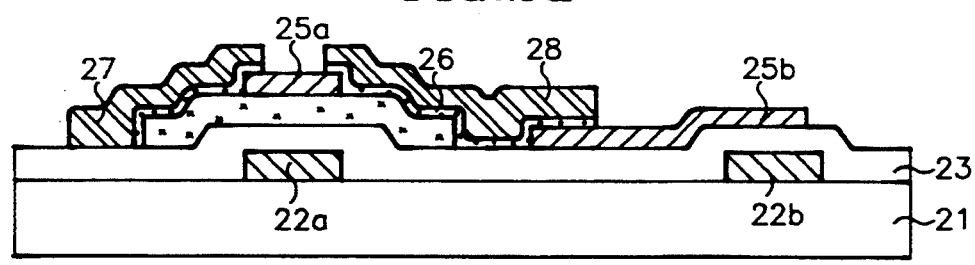

As shown in FIG. 2(d), by depositing an ohmic contact high density n conductive layer (hereinafter called 'n+ layer') and source and drain electrode metal successively on the entire surface and, carrying out a patterning process (that is, a photo process and an etching process) for the n+ layer and the metal together, a source electrode 27 and a drain electrode 28 are formed. The source electrode 27 is formed over the surfaces of the active layer 24 and on one side of the ITO film pattern 25a. The drain electrode 28 extends from the other side of the ITO film pattern 25a across the active layer 24 to the surface of one side of the pixel electrode 25b leaving space between the source electrode 27 and the drain electrode 28. This process results in an ohmic contact n+ layer 26 being formed automatically beneath the source electrode 27 and the drain electrode 28.

Figure 2E:
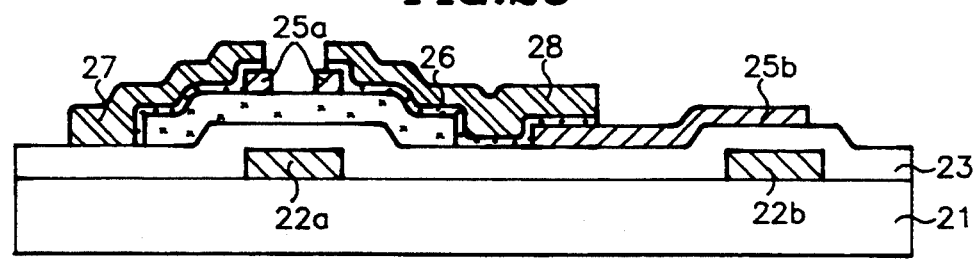
Figure 2F:
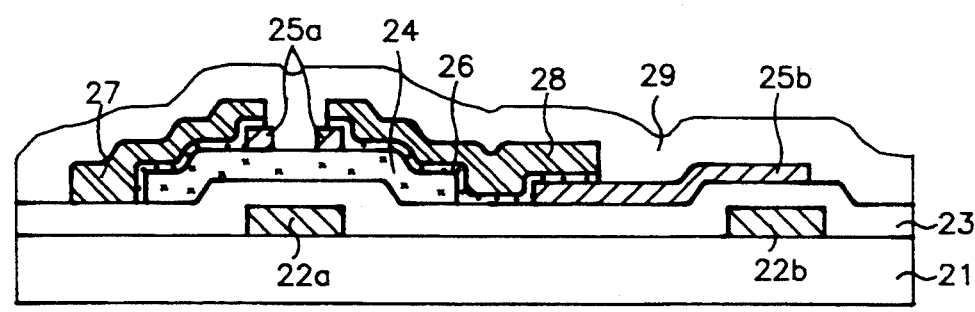

After successively removing the exposed n+ layer pattern 26 over the active layer 24 positioned between the source electrode 27 and the drain electrode 28, and removing the ITO film pattern 25a positioned beneath the n+ layer pattern 26, as shown in FIG. 2(e), an element protection insulation film 29 is formed on the entire exposed surface as shown in FIG. 2(f).

This invention has many advantages. By forming an ITO film pattern 25a having a fixed lateral width on the active layer 24 and the pixel electrode 25b before forming the n+ layer, the ITO pattern 25a can be used as an etch stopper in the process of etching the n+ layer pattern 26 positioned between the source electrode 27 and the drain electrode 28.

Accordingly, the possibility of damage to the active layer 24, which is liable to be caused by a large amount of etching of the n+ layer pattern 26, can be eliminated and the yield of the process of fabricating a thin film transistor can be improved.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for fabricating a thin film transistor comprising steps for:

forming a first gate electrode and a second gate electrode spaced at a fixed interval on an exposed surface of a transparent insulation substrate;

forming a gate insulation film on the entire exposed surface and forming an active layer on a surface portion of the gate insulation film overlying the first gate electrode;

depositing transparent conductive material on the entire exposed surface and patterning the deposited conductive material to form a transparent conductive material pattern on a surface portion of the active layer overlying an upper side of the first gate electrode and forming a pixel electrode on a surface portion of the gate insulation film extending laterally from the surface portion of the gate insulation film overlying the second gate electrode toward the active layer leaving space between the active layer and the pixel electrode;

forming, successively, an ohmic contact semiconductor layer and an electrode metal having a designated conduction type on the entire exposed surfaces and carrying out patterning of both to form a source electrode over the exposed surfaces of one side of the active layer and to form a drain electrode on the other side of the active layer, the drain electrode extending laterally from the other side of the active layer to the surface portion of one side of the pixel electrode leaving space between the drain electrode and the source electrode, an ohmic contact semiconductor layer is automatically formed beneath the source electrode and the drain electrode; and forming an element protection insulation film on the entire exposed surface after successively removing exposed semiconductor layer pattern on the active layer positioned between the source electrode and the drain electrode and the transparent conductive material pattern positioned beneath the semiconductor layer pattern.

2. The method for fabricating a thin film transistor as claimed in claim 1, wherein the transparent conductive material used for the pixel electrode is indium tin oxide.

3. The method for fabricating a thin film transistor as claimed in claim 1, wherein the designated conduction type of the semiconductor layer is n type.

4. The method for fabricating a thin film transistor as claimed in claim 1, wherein the material of the active layer is intrinsic amorphous silicon.

* * * * *